US009523709B2

(12) United States Patent
Otsubo

(10) Patent No.: US 9,523,709 B2
(45) Date of Patent: Dec. 20, 2016

(54) METHOD OF MANUFACTURING MULTILAYER WIRING BOARD, PROBE CARD INCLUDING MULTILAYER WIRING BOARD MANUFACTURED BY THE METHOD, AND MULTILAYER WIRING BOARD

(71) Applicant: Murata Manufacturing Co., Ltd., Nagaokakyo-shi, Kyoto-fu (JP)

(72) Inventor: Yoshihito Otsubo, Nagaokakyo (JP)

(73) Assignee: Murata Manufcaturing Co., Ltd., Kyoto (JP)

( * ) Notice: Subject to any disclaimer, the term of this patent is extended or adjusted under 35 U.S.C. 154(b) by 386 days.

(21) Appl. No.: 14/302,534

(22) Filed: Jun. 12, 2014

(65) Prior Publication Data
US 2015/0008951 A1 Jan. 8, 2015

(30) Foreign Application Priority Data

Jul. 4, 2013 (JP) ................. 2013-140530

(51) Int. Cl.
*G01R 31/00* (2006.01)
*G01R 1/04* (2006.01)
(Continued)

(52) U.S. Cl.
CPC ......... *G01R 1/0408* (2013.01); *G01R 1/07378* (2013.01); *H05K 1/0268* (2013.01);
(Continued)

(58) Field of Classification Search
CPC ............ G01R 31/2889; G01R 1/07307; G01N 2201/12; G01N 21/6408; H01L 2924/0002; H01L 2924/1306; H05K 3/4644; H05K 1/0326; H05K 3/4629; H05K 1/0271
(Continued)

(56) References Cited

U.S. PATENT DOCUMENTS

| 7,544,898 B2 * | 6/2009 | Hirano | G06F 3/045 174/259 |
| 2009/0294167 A1 | 12/2009 | Nomiya | |
| 2013/0330509 A1 * | 12/2013 | Otsubo | H05K 3/1258 428/137 |

FOREIGN PATENT DOCUMENTS

| JP | 2001-257473 A | 9/2001 |
| JP | 2007-66933 A | 3/2007 |

(Continued)

OTHER PUBLICATIONS

Official Communication issued in corresponding Japanese Patent Application No. 2013-140530, mailed on Apr. 7, 2015.

*Primary Examiner* — Melissa Koval
*Assistant Examiner* — Trung Nguyen
(74) *Attorney, Agent, or Firm* — Keating & Bennett, LLP

(57) ABSTRACT

A method of manufacturing a multilayer wiring board includes a stacking process in which insulating layers, each of which includes a ceramic layer and a shrinkage suppression layer being stacked on top of the ceramic layer, are stacked on top of one another, a press-bonding process in which the insulating layers are press-bonded, so that a multilayer body is formed, and a firing process in which the multilayer body is fired. In the stacking process, in each of the insulating layers, a wiring electrode is formed on a surface of the shrinkage suppression layer on the opposite side to the surface of the layer facing the ceramic layer, and the thickness of a peripheral area of the shrinkage suppression layer located around the area of the shrinkage suppression layer that is in contact with the electrode is larger than those of portions of the layer except for the peripheral area.

20 Claims, 13 Drawing Sheets

(51) Int. Cl.
  *H05K 1/02* (2006.01)
  *H05K 3/46* (2006.01)
  *G01R 1/073* (2006.01)
  *H05K 3/40* (2006.01)
  *G01R 3/00* (2006.01)
(52) U.S. Cl.
  CPC ............. *H05K 3/4629* (2013.01); *G01R 3/00* (2013.01); *H05K 3/4007* (2013.01); *H05K 2201/09136* (2013.01)
(58) Field of Classification Search
  USPC ....... 324/762.1, 600, 548, 661, 500, 763.01, 324/763.02, 754.07, 750.3, 750.15, 324/754.01–754.03; 29/623.1, 846, 592.1, 29/602.1, 890.03, 606, 852; 156/89.12, 156/62.2; 174/258
  See application file for complete search history.

(56) References Cited

FOREIGN PATENT DOCUMENTS

| WO | 2008/108172 A1 | 9/2008 |
| WO | 2012/121141 A1 | 9/2012 |

* cited by examiner

METHOD OF MANUFACTURING MULTILAYER WIRING BOARD, PROBE CARD INCLUDING MULTILAYER WIRING BOARD MANUFACTURED BY THE METHOD, AND MULTILAYER WIRING BOARD

BACKGROUND OF THE INVENTION

1. Field of the Invention

The present invention relates to a method of manufacturing a multilayer wiring board including a plurality of insulating layers, each of which includes a ceramic layer and a shrinkage suppression layer that is stacked on top of the ceramic layer, being fixed to one another by applying pressure and then fired, a probe card that includes a multilayer wiring board that is manufactured by the method, and a multilayer wiring board.

2. Description of the Related Art

In the related art, a multilayer wiring board is capable of having high dimensional accuracy such as a multilayer wiring board 100 illustrated in FIG. 13. The multilayer wiring board 100 includes a multilayer body including a plurality of insulating layers 101, each of which includes a ceramic layer 101a and a shrinkage suppression layer 101b that is stacked on top of the ceramic layer 101a, being stacked on top of one another in a predetermined order, fixed to one another by applying pressure, and then fired, and various wiring electrodes 102 and via conductors 103 are formed on major surfaces of the insulating layers 101 and in areas inside the insulating layers 101. In this case, the shrinkage suppression layers 101b suppress shrinkage of the ceramic layers 101a at the time of firing of the multilayer body, and thus, high dimensional accuracy can be obtained for the multilayer wiring board 100, which is a completed body, after the firing. An example of the related art is International Publication No. WO 2008/108172 (for example, see [0028] to [0031], and FIG. 3).

However, in the multilayer wiring board 100 of the related art, the wiring electrodes 102 are patterned on the shrinkage suppression layers 101b of the insulating layers 101, and thus, when the insulating layers 101 are stacked on top of one another, in the same shrinkage suppression layer 101b, there will be a portion that is interposed between the corresponding ceramic layer 101a and one of the wiring electrodes 102 and a portion that is not interposed between the corresponding ceramic layer 101a and one of the wiring electrodes 102. In this case, when the layers of the multilayer body are fixed to one another by applying pressure, in the same shrinkage suppression layer 101b, a compressive stress that is applied to a portion that is interposed between the corresponding ceramic layer 101a and one of the wiring electrodes 102, is larger than a compressive stress that is applied to a portion that is not interposed between the corresponding ceramic layer 101a and one of the wiring electrodes 102, and the thickness of the portion of the shrinkage suppression layer 101b, which is interposed between the corresponding ceramic layer 101a and one of the wiring electrodes 102, is smaller than the thickness of the portion of the shrinkage suppression layer 101b, which is not interposed between the corresponding ceramic layer 101a and one of the wiring electrodes 102. In this case, particularly the thickness of a portion of the shrinkage suppression layer 101b around the periphery of one of the wiring electrodes 102 becomes small. In this case, a shrinkage suppression force of a portion of the shrinkage suppression layer 101b the thickness of which has been reduced acting on the corresponding ceramic layer 101a decreases, and in the multilayer wiring board 100, there will be portions of the ceramic layers 101a that have different amounts of shrinkage at the time of firing. In addition, in the case where the shrinkage suppression force decreases as described above, the degree of shrinkage of the ceramic layers 101a in a planar direction increases, and the degree of shrinkage of the ceramic layers 101a in a vertical direction decreases. Thus, for example, portions of the surface of the multilayer wiring board 100 around the periphery of the corresponding wiring electrodes 102 protrude, and the flatness of the multilayer wiring board 100 may deteriorate, and warpage, a fracture, a crack, and the like may occur in the multilayer wiring board 100. In addition, in the case where this type of multilayer wiring board such as the multilayer wiring board 100 is used in a probe card or for rewiring, there will be a portion in which the wiring electrodes 102 are concentrated in a portion of the multilayer wiring board 100, and thus, the above-described problems will become notable.

SUMMARY OF THE INVENTION

Accordingly, preferred embodiments of the present invention provide a method of manufacturing a multilayer wiring board capable of reducing the risk of deterioration of flatness, warpage, a fracture, and so forth while securing high dimensional accuracy.

According to a preferred embodiment of the present invention, a method of manufacturing a multilayer wiring board includes a stacking process in which a plurality of insulating layers, each of which includes a ceramic layer and a shrinkage suppression layer that is stacked on top of the ceramic layer and that suppresses shrinkage of the ceramic layer, are stacked on top of one another, a press-bonding process in which the plurality of insulating layers are fixed to one another by applying pressure, so that a multilayer body is formed, and a firing process in which the multilayer body is fired. In at least one of the insulating layers, a wiring electrode is formed on a surface of the shrinkage suppression layer on an opposite side to a surface of the shrinkage suppression layer that faces the ceramic layer in the stacking process, and a thickness of at least a peripheral area of the shrinkage suppression layer that is located around a periphery of a contact area of the shrinkage suppression layer that is in contact with the wiring electrode is set to be larger than thicknesses of portions of the shrinkage suppression layer except for the peripheral area.

As described above, in the stacking process, the thickness of the peripheral area around the periphery of the contact area, which is in contact with the wiring electrode, of the shrinkage suppression layer of at least one of the insulating layers on which the wiring electrode is to be formed is set to be larger than the thicknesses of portions of the shrinkage suppression layer except for the peripheral area, so that the thickness of the peripheral area of the shrinkage suppression layer that would have been reduced at the time of fixing the layers of the multilayer body to one another by applying pressure is prevented from being reduced. Therefore, shrinkage of the ceramic layers at the time of firing is significantly reduced or prevented with certainty with or without the wiring electrode and regardless of the density of the wiring electrode, and as a result, a multilayer wiring board that has high dimensional accuracy is provided.

In addition, the thickness of the peripheral area of each of the shrinkage suppression layers is prevented from being reduced, so that, in the multilayer wiring board, a difference in the amount of shrinkage of the ceramic layers at the time of firing between a portion in which one of the wiring electrodes is formed and a portion in which one of the wiring electrodes is not formed will not occur, and thus, the risk of things such as deterioration of the flatness of the multilayer wiring board and occurrence of a fracture and a crack in the multilayer wiring board is significantly reduced or eliminated. Furthermore, while the risk of deterioration of the flatness of the multilayer wiring board and occurrence of a fracture and a crack in the multilayer wiring board is significantly reduced or eliminated, densification of the wiring electrodes and a significant reduction in the pitch of the wiring electrodes is also achieved.

In the stacking process, in the at least one of the insulating layers, the thickness of the contact area of the shrinkage suppression layer, which is in contact with the wiring electrode, preferably is set to be larger than the thickness of portions of the shrinkage suppression layer except for the contact area and the peripheral area. With this configuration, as compared with the case where the thickness of only the peripheral area of the shrinkage suppression layer around the periphery of the contact area of the shrinkage suppression layer, which is in contact with the wiring electrode, is set to be larger than the thicknesses of the other areas of the shrinkage suppression layer, the portion of the shrinkage suppression layer whose thickness is set to be large is easily formed. In addition, the area of the portion of the shrinkage suppression layer whose thickness is set to be large is increased, so that, for example, even if the wiring electrode is displaced when the wiring electrode is formed, the wiring electrode does not easily separate from the portion of the shrinkage suppression layer whose thicknesses has been increased, and thus, tolerance for positional deviation of the wiring electrode is also greatly improved.

In the stacking process, the shrinkage suppression layer of the at least one of the insulating layers preferably is disposed to define an uppermost layer or a lowermost layer of the multilayer body, and a land electrode for external connection may be formed by the wiring electrode. Regarding a compressive stress that is applied to each of the insulating layers at the time of press-bonding the layers of the multilayer body, in the insulating layer that is positioned as an inner layer, since a stress that is applied at the time of press-bonding is absorbed and reduced by the other insulating layers, subduction of the wiring electrodes toward the insulating layers that causes the thicknesses of the shrinkage suppression layers to be reduced is small. On the other hand, in the insulating layers that define the uppermost layer and the lowermost layer, respectively, a factor responsible for absorption and reduction of a stress at the time of press-bonding is smaller than that in the insulating layer, which is positioned as the inner layer. Thus, a larger compressive stress is applied to the insulating layers, which are the uppermost layer and the lowermost layer, respectively, compared with to the insulating layer, which is positioned as the inner layer, and the subduction of the wiring electrodes toward the insulating layers, which causes the thicknesses of the shrinkage suppression layers to be reduced, becomes larger. Therefore, in the case where there is a wiring electrode such as a land electrode for external connection that is to be disposed on the uppermost layer or the lowermost layer, the thickness of a portion of the shrinkage suppression layer around the periphery of the wiring electrode is likely to be smaller than the thicknesses of the other portions of the shrinkage suppression layer, and the deterioration of the flatness of the multilayer wiring board and occurrence of warpage and a crack in the multilayer wiring board are likely to occur. Accordingly, in the insulating layer that is either the uppermost layer or the lowermost layer on which a land electrode for external connection is to be formed, the thicknesses of areas of the shrinkage suppression layers of the insulating layers around the periphery of the land electrodes are set to be larger than the thicknesses of the other areas of the shrinkage suppression layers in the stacking process, so that a multilayer wiring board that has a high effect of reducing occurrence of deterioration of the flatness of the multilayer wiring board and occurrence of warpage and a crack in the multilayer wiring board is capable of being manufactured.

It is preferable that the shrinkage suppression layer of each of the insulating layers includes, as a main component, a flame-retardant powder that is not sintered at a sintering temperature of a ceramic raw material powder out of which the ceramic layers are made. With this configuration, the shrinkage suppression layers will not be sintered at the time of firing the multilayer body, and thus, such a flame-retardant powder is suitable for a material out of which the shrinkage suppression layers are made.

A multilayer wiring board that is manufactured by this manufacturing method may be used in a probe card, for example. As described above, in a multilayer wiring board that is used in a probe card, there is a portion in which wiring electrodes are concentrated, and thus, there is a high risk of deterioration of the flatness of the multilayer wiring board and occurrence of warpage and a crack in the multilayer wiring board. Therefore, a multilayer wiring board that is manufactured by the manufacturing method according to various preferred embodiments of the present invention is suitable for a multilayer wiring board that is included in a probe card.

According to another preferred embodiment of the present invention, a multilayer wiring board includes a multilayer body including a plurality of insulating layers stacked on top of one another, each of which includes a ceramic layer and a shrinkage suppression layer that is stacked on top of the ceramic layer and that suppresses shrinkage of the ceramic layer, the insulating layers being fixed and pressure bonded to one another and fired. The multilayer body includes a recess that is formed as a result of the shrinkage suppression layer of one of the insulating layers, which is an uppermost layer of the multilayer body, being bent and includes a wiring electrode that is configured such that the recess is filled with the wiring electrode. The thickness of a portion of the shrinkage suppression layer of the insulating layer, which is the uppermost layer, that is used to define the recess is larger than thicknesses of other portions of the shrinkage suppression layer. In this case, regarding the insulating layer, which is the uppermost layer, the thickness of the portion of the shrinkage suppression layer, which is used to define the recess in which the wiring electrode is disposed is larger than the thicknesses of the other portions of the shrinkage suppression layer, and thus, the risk of deterioration of the flatness of the multilayer wiring board and occurrence of warpage and a crack in the multilayer wiring board due to the thickness of a portion of the shrinkage suppression layer around the periphery of the wiring electrode that has become smaller than the thicknesses of the other portions of the shrinkage suppression layer as in the case of a multilayer wiring board of the related art is significantly reduced or eliminated.

The shrinkage suppression layer of the insulating layer, which is the uppermost layer, preferably covers a portion of the wiring electrode at a boundary between the wiring electrode and an opening of the recess. The shrinkage suppression layer covers the portion of the wiring electrode at a boundary between the wiring electrode and an opening of the recess as described above, so that the wiring electrode is prevented from being separated from the shrinkage suppression layer.

According to various preferred embodiments of the present invention, the thickness of a peripheral area of a shrinkage suppression layer of at least one of insulating layers on which a wiring electrode is provided that is located around the periphery of a contact area of the shrinkage suppression layer that is in contact with the wiring electrode preferably is larger than the thicknesses of portions of the shrinkage suppression layer except for the peripheral area, so that the thickness of the peripheral area of the shrinkage suppression layer that would have been reduced at the time of fixing layers of a multilayer body to one another by applying pressure in the case where a manufacturing method of the related art is used can be prevented from being reduced. Therefore, shrinkage of ceramic layers at the time of firing is significantly reduced or prevented with certainty with or without a wiring electrode and regardless of the density of a wiring electrode, and as a result, a multilayer wiring board that has high dimensional accuracy is provided.

In addition, in a multilayer wiring board, a difference in the amount of shrinkage of the ceramic layers at the time of firing between a portion in which a wiring electrode is formed and a portion in which a wiring electrode is not formed is significantly reduced or prevented, and thus, the risk of things such as deterioration of the flatness of the multilayer wiring board and occurrence of a fracture and a crack in the multilayer wiring board is significantly reduced or prevented.

Furthermore, in a multilayer wiring board that is used in a probe card, there is a portion in which wiring electrodes are concentrated, and thus, there is a high risk of deterioration of the flatness of the multilayer wiring board and occurrence of warpage and a crack in the multilayer wiring board. Therefore, a multilayer wiring board that is manufactured by the manufacturing method according to various preferred embodiments of the present invention is suitable for a multilayer wiring board that is included in a probe card.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
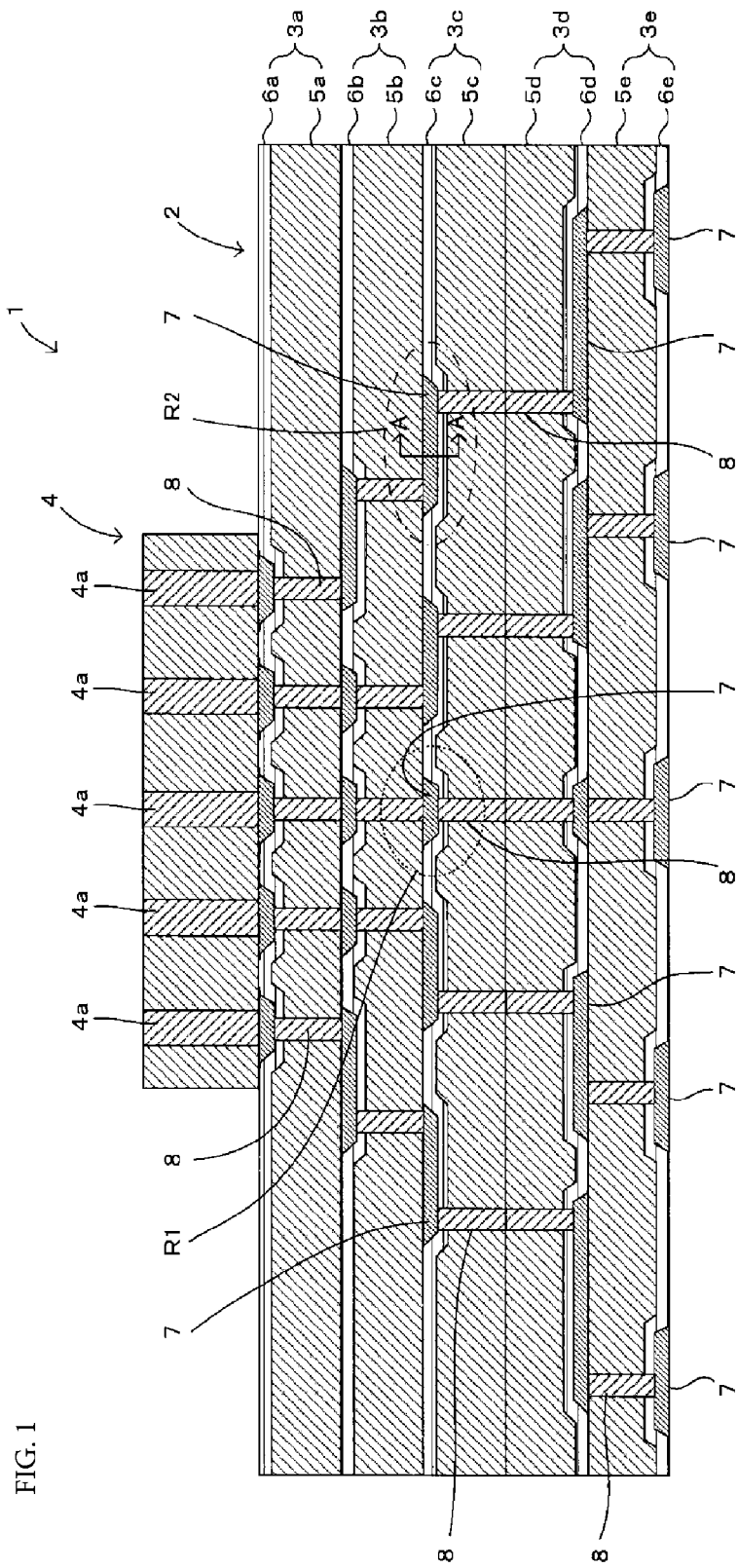
FIG. 1 is a schematic sectional view of a probe card that includes a multilayer wiring board according to a first preferred embodiment of the present invention.
Figure 2:
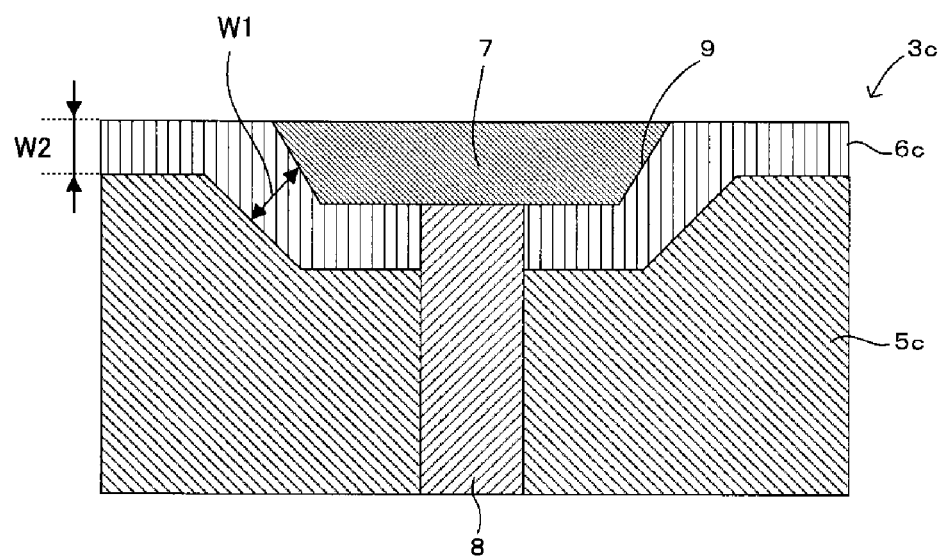
FIG. 2 is an enlarged view of a principal portion of FIG. 1.

A probe card 1 that includes a multilayer wiring board 2 according to a first preferred embodiment of the present invention will be described with reference to FIG. 1 and FIG. 2. FIG. 1 is a schematic sectional view of the probe card 1 that includes the multilayer wiring board 2 according to the first preferred embodiment of the present invention, and FIG. 2 is an enlarged sectional view of the R1 area of FIG. 1, which is a principal portion of the multilayer wiring board 2.

The probe card 1 includes the multilayer wiring board 2 and a terminal portion 4 that includes a plurality of terminal pins 4a. The probe card 1 is used when, for example, electrical characteristics of an integrated circuit (IC) that is formed on a silicon wafer are tested.

The multilayer wiring board 2 includes a plurality of insulating layers 3a to 3e, the plurality of insulating layers 3a to 3e including ceramic layers 5a to 5e and shrinkage suppression layers 6a to 6e that are stacked on top of the ceramic layers 5a to 5e, respectively. The multilayer wiring board 2 is preferably formed by firing a multilayer body obtained by stacking the insulating layers 3a to 3e on top of one another in a predetermined order and fixing them to one another by applying pressure. Note that in the case where one of the ceramic layers 5a to 5e is disposed as the uppermost layer or the lowermost layer of the multilayer wiring board 2, a fracture may occur in the multilayer wiring board 2. Thus, in the present preferred embodiment, the multilayer wiring board 2 preferably has a configuration in which the insulating layers 3a to 3e are stacked on top of one another while the positional relationship between each of the ceramic layers 5a to 5e and the corresponding one of the shrinkage suppression layers 6a to 6e in a top-bottom direction is reversed at a boundary between the insulating layers 3c and 3d, which are inner layers, so that the shrinkage suppression layers 6a and 6e are respectively disposed as the uppermost layer and the lowermost layer of the multilayer wiring board 2. With this configuration, the shrinkage suppression layers 6a and 6e are respectively disposed as the uppermost layer and the lowermost layer of the multilayer wiring board 2, and occurrence of a fracture in the multilayer wiring board 2 caused by a compressive stress that is applied to an outer surface of the multilayer wiring board 2 is significantly reduced or prevented.

Each of the ceramic layers 5a to 5e preferably is made of, for example, low-temperature co-fired ceramic (LTCC). A portion of each of the ceramic layers 5a to 5e (e.g., a glass component) penetrates into the corresponding one of the shrinkage suppression layers 6a to 6e at the time of firing of the multilayer body, and each of the ceramic layers 5a to 5e and the corresponding adjacent one of the shrinkage suppression layers 6a to 6e are joined to each other. Note that, in the present preferred embodiment, each of the ceramic layers 5a to 5e preferably is formed in such a manner as to have a thickness in a range of about 25 μm to about 100 μm, for example.

Each of the shrinkage suppression layers 6a to 6e contains, as a main component, a flame-retardant powder (e.g., alumina) that is not sintered at a sintering temperature of a ceramic raw material powder out of which each of the ceramic layers 5a to 5e is made. Therefore, the shrinkage suppression layers 6a to 6e are not likely to shrink at the time of firing of the multilayer body, and thus, the shrinkage suppression layers 6a to 6e suppress shrinkage of the ceramic layers 5a to 5e each of which is adjacent to and is joined to the corresponding one of the shrinkage suppression layers 6a to 6e, particularly shrinkage of the ceramic layers 5a to 5e in a surface direction. Note that if the thickness of each of the shrinkage suppression layers 6a to 6e is too large, the amount of moisture with which each of the shrinkage suppression layers 6a to 6e is impregnated becomes large, and a problem in terms of reliability such as corrosion of the multilayer wiring board 2 may occur. Therefore, it is preferable that the thickness of each of the shrinkage suppression layers 6a to 6e be about 2 μm to about 5 μm, for example.

Various wiring electrodes 7 are formed on the surfaces of the shrinkage suppression layers 6a to 6e that are on the opposite side to the surfaces of the shrinkage suppression layers 6a to 6e that face the corresponding ceramic layers 5a to 5e, and a plurality of via conductors 8 that connect the wiring electrodes 7 between the layers are formed in areas inside the insulating layers 3a to 3e. Note that, in the present preferred embodiment, each of the wiring electrodes 7 is preferably formed in such a manner as to have a thickness in a range of about 5 μm to about 15 μm, for example.

As illustrated in FIG. 2, one of the wiring electrodes 7 is formed in such a manner that a recess 9 that is formed by bending the shrinkage suppression layer 6c, which is adjacent to the wiring electrode 7, is filled with the wiring electrode 7. In this case, in a portion of the shrinkage suppression layer 6c that is used for forming the recess 9, a portion around the periphery of the wiring electrode 7 is formed in such a manner as to have a thickness W1 that is larger than a thickness W2 of another portion. Note that the thickness W1 of the portion of the shrinkage suppression layer 6c, which is used for forming the recess 9, is not necessarily larger than the thickness W2 of the other portion, and the portion of the shrinkage suppression layer 6c, which is used for forming the recess 9, may be formed in such a manner as to have a thickness equal to or larger than the thickness W2. The recess 9 is formed as a result of the shrinkage suppression layer 6c being pressed by the wiring electrode 7 when the layers of the multilayer body are fixed to one another by applying pressure, and in each of the shrinkage suppression layers 6a to 6e, the recess 9 is formed in an area in which the wiring electrode 7 is to be formed.

The wiring electrodes 7 that are formed on the uppermost layer (the shrinkage suppression layer 6a) of the multilayer wiring board 2 and the wiring electrodes 7 that are formed on the lowermost layer (the shrinkage suppression layer 6e) of the multilayer wiring board 2 are formed in such a manner as to function as land electrodes for external connection.

A method of manufacturing the multilayer wiring board 2 according to the present preferred embodiment will now be described with reference to FIG. 3A to FIG. 5. Note that FIGS. 3A to 3D are sectional views of the R2 area of FIG. 1 that is surrounded by a one dot chain line taken along line A-A, FIGS. 4A to 4D are diagrams illustrating the R1 area of FIG. 1 that is surrounded by a dashed line, and FIG. 5 is a plan view of the shrinkage suppression layer 6c including one of the wiring electrodes 7 that is formed in the R2 area of FIG. 1. FIGS. 3A to 3D illustrate an area in which only one of the wiring electrodes 7 is formed, and FIGS. 4A to 4D illustrate an area in which one of the via conductors 8 is connected to a corresponding one of the wiring electrodes 7. In the method of manufacturing the multilayer wiring board 2, which will be described below, the area in which only one of the wiring electrodes 7 is formed and the area in which one of the via conductors 8 is connected to the corresponding one of the wiring electrodes 7 will be described together.

Figure 3A:
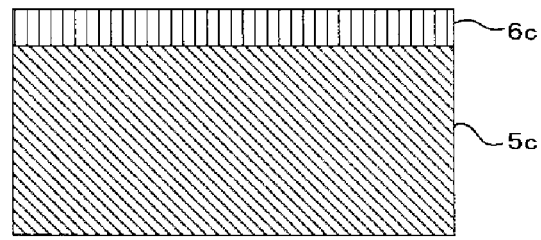
FIGS. 3A to 3D are explanatory diagrams describing a method of manufacturing the multilayer wiring board illustrated in FIG. 1.

First, the insulating layers 3a to 3e that form a portion of the multilayer wiring board 2 are prepared. For example, regarding the insulating layer 3c, which will be described as an example, as illustrated in FIG. 3A, the shrinkage suppression layer 6c in paste form that contains a flame-retardant powder such as alumina or zirconia as a main component is stacked on top of a ceramic green sheet, which forms the ceramic layer 5c, and dried by using a printing technique or the like. Note that, in the present preferred embodiment, the solid component of each of the shrinkage suppression layers 6a to 6e is a mixture of alumina and glass, and the weight ratio of alumina to glass is about 2:1, for example. The paste of each of the shrinkage suppression layers 6a to 6e preferably is made by adjusting the content of the mixture in an organic binder and an organic solvent to about 30 wt % to about 50 wt %, for example.

Figure 4A:
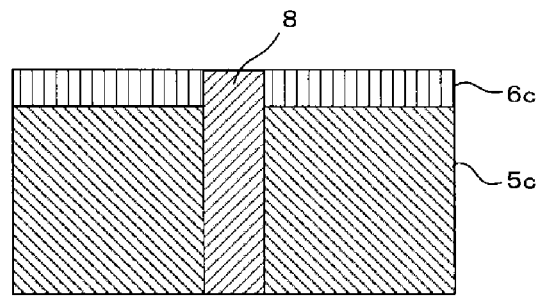
FIGS. 4A to 4D are explanatory diagrams describing the method of manufacturing the multilayer wiring board illustrated in FIG. 1.
Figure 5:
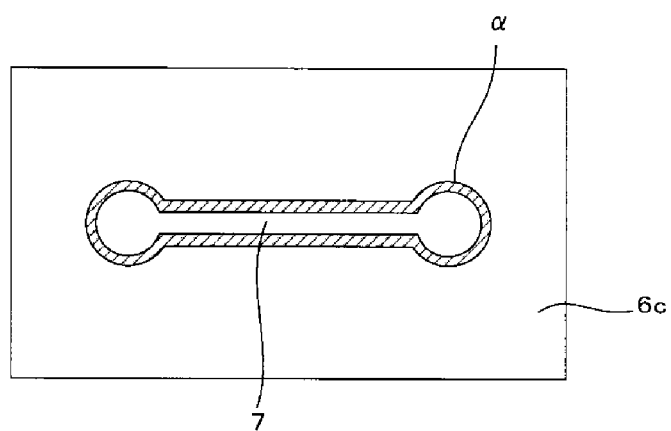
FIG. 5 is a plan view of a shrinkage suppression layer including a wiring electrode that is provided in the R2 area of FIG. 1.

Next, regarding an area in the insulating layer 3c in which one of the via conductors 8 is to be formed, as illustrated in FIG. 4A, a through hole is formed in the area by using a laser beam or the like, and the via conductor 8 is formed by a well-known method.

Figure 3B:
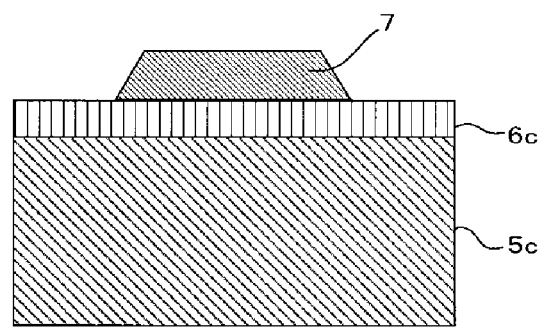
Figure 3C:
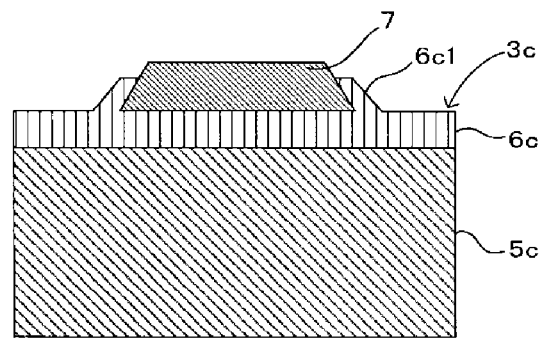
Figure 4B:
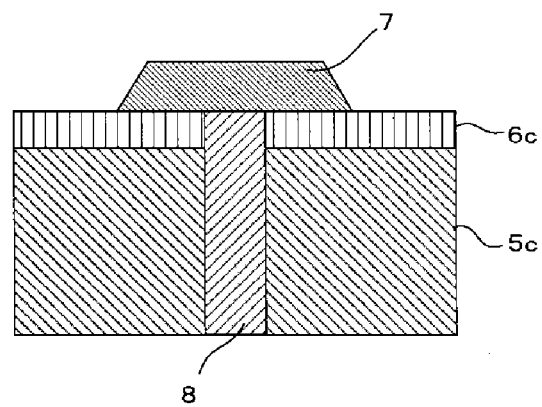
Figure 4C:
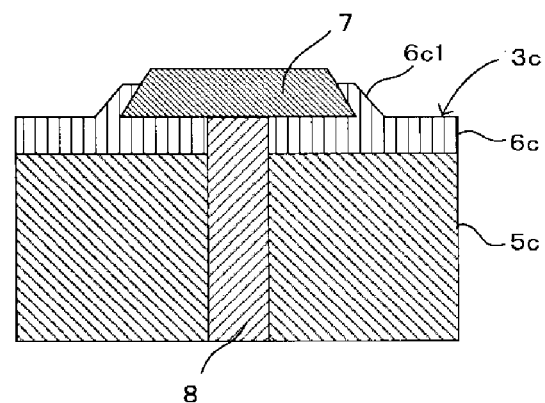

Next, as illustrated in FIG. 3B and FIG. 4B, one of the wiring electrodes 7 is formed on the surface of the shrinkage suppression layer 6c that is on the opposite side to the surface of the shrinkage suppression layer 6c that faces the ceramic layer 5c by a printing technique using a conductive paste such as a copper paste or the like, and after that, as illustrated in FIG. 3C and FIG. 4C, a thick portion 6c1 that causes the thickness of the shrinkage suppression layer 6c to increase is formed. More specifically, the paste of the shrinkage suppression layer 6c is applied again onto a peripheral area of the shrinkage suppression layer 6c that is around the periphery of a contact area of the shrinkage suppression layer 6c that is in contact with one of the wiring electrodes 7 by using a printing technique or the like in such a manner that the thickness of the peripheral area becomes larger than the thicknesses of portions of the shrinkage suppression layer 6c except for the peripheral area. In this case, the above-mentioned peripheral area of the shrinkage suppression layer 6c corresponds to a hatched portion α

(hereinafter sometimes referred to as a peripheral area α) in FIG. 5, which is the plan view of the shrinkage suppression layer 6c including one of the wiring electrodes 7. In addition, in this case, the paste of the shrinkage suppression layer 6c is applied again in such a manner as to cover a portion of a side surface of the wiring electrode 7.

Figure 3D:
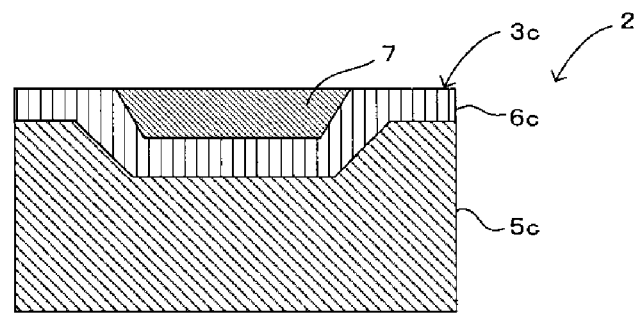
Figure 4D:
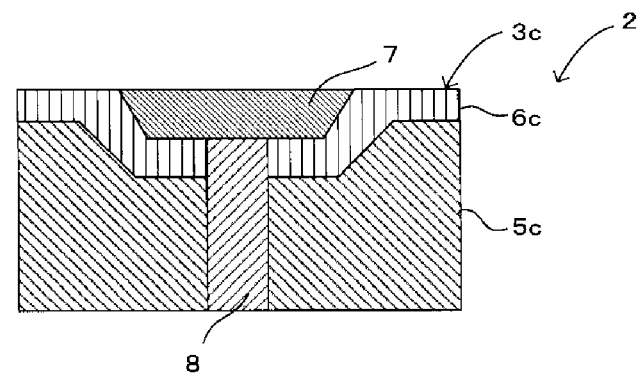

Next, the insulating layers 3a to 3e that have been fabricated in the same manner as above are stacked on top of one another in a predetermined order (a stacking process), and after that, the insulating layers 3a to 3e, which have been stacked on top of one another, are fixed to one another by applying pressure, so that a multilayer body is formed (a press-bonding process). In this case, as illustrated in FIG. 3D and FIG. 4D, one of the recesses 9 is formed as a result of the shrinkage suppression layer 6c being bent by being pressed by the wiring electrode 7, and as a result, the wiring electrode 7 comes to be disposed in the recess 9. As in the case of using a method of manufacturing a multilayer wiring board of the related art, in the case where the peripheral area α of the shrinkage suppression layer 6c is not formed in such a manner as to have a thickness larger than the thicknesses of the other portions of the shrinkage suppression layer 6c, the thickness of a portion of the shrinkage suppression layer 6c that is used for forming the recess 9, particularly a portion that is positioned at the periphery of the wiring electrode 7 (a portion that forms a side wall of the recess 9) may become smaller than the thicknesses of the other areas in the shrinkage suppression layer 6c. However, in the present preferred embodiment, the thick portion 6c1 is formed in such a manner as to have a large thickness in advance in the processes illustrated in FIG. 3C and FIG. 4C, so that, regarding the thickness of the shrinkage suppression layer 6c after press-bonding, the thickness of the portion of the shrinkage suppression layer 6c, which is used for forming the recess 9 in which the wiring electrodes 7 is to be disposed, is equal to or larger than the thicknesses of the other portions of the shrinkage suppression layer 6c.

Finally, manufacture of the multilayer wiring board 2 is completed by firing the multilayer body. In this case, since the shrinkage suppression layers 6a to 6e do not have a portion whose thickness becomes smaller at the time of press-bonding, the shrinkage suppression layers 6a to 6e effectively suppress or prevent shrinkage of the ceramic layers 5a to 5e each of which is adjacent to the corresponding one of the shrinkage suppression layers 6a to 6e at the time of firing and reduce the risk of warpage, a fracture, or a crack occurring in the multilayer wiring board 2.

A modification of the method of manufacturing the multilayer wiring board 2 of the present preferred embodiment will now be described with reference to FIGS. 6A and 6B. Note that FIGS. 6A and 6B are diagrams illustrating a method of manufacturing the multilayer wiring board 2 according to the present modification, and FIG. 6A and FIG. 6B correspond to FIG. 3C and FIG. 3D, respectively.

Figure 6A:
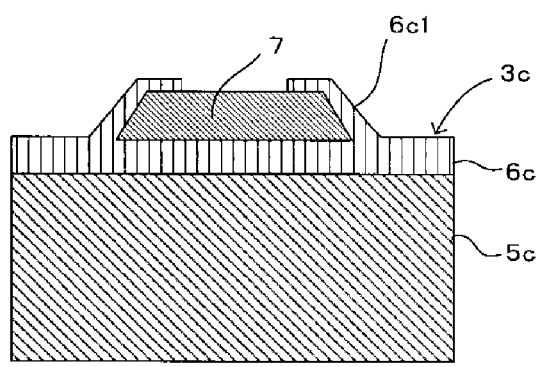
FIGS. 6A to 6B are diagrams illustrating a modification of the method of manufacturing the multilayer wiring board illustrated in FIG. 1.
Figure 6B:
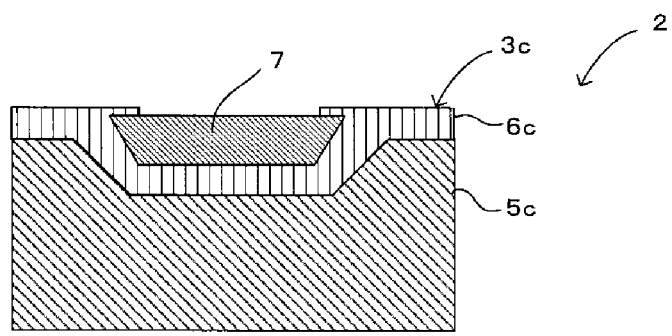

For example, when the paste of the shrinkage suppression layer 6c is applied again onto the peripheral area α, which is illustrated in FIG. 5 and which is positioned around the periphery of the contact area of the shrinkage suppression layer 6c, which is in contact with the wiring electrode 7, as illustrated in FIG. 6A, the paste of the shrinkage suppression layer 6c may be applied in such a manner as to cover a side surface of the wiring electrode 7 and the circumferential edge portion of the surface of the wiring electrode 7 that is on the opposite side to a major surface of the wiring electrode 7 that is in contact with the shrinkage suppression layer 6c. In this case, in the multilayer wiring board 2 after the layers of the multilayer body have been fixed to one another by applying pressure and fired, as illustrated in FIG. 6B, the shrinkage suppression layer 6c is formed in a state of covering a portion of the wiring electrode 7 at the boundary between the wiring electrode 7 and an opening of the recess 9, and the wiring electrode 7 is prevented from being separated from the shrinkage suppression layer 6c. The present modification may preferably be applied to the other insulating layers 3a, 3b, 3d, and 3e, for example.

Therefore, according to the above-described preferred embodiment, in the stacking process, in the insulating layers 3a to 3e, each of the peripheral areas α around the periphery of the contact areas of the shrinkage suppression layers 6a to 6e that are in contact with the corresponding wiring electrodes 7 is formed in such a manner as to have a thickness that is larger than the thicknesses of portions of the corresponding one of the shrinkage suppression layers 6a to 6e except for the peripheral area α, so that, as illustrated in FIG. 2 and the like, the thicknesses of the peripheral areas α of the shrinkage suppression layers 6a to 6e that would have been reduced when the insulating layers 3a to 3e are fixed to one another by applying pressure are prevented from being reduced. Thus, shrinkage of the ceramic layers 5a to 5e at the time of firing is significantly reduced or prevented with certainty with or without the wiring electrodes 7 and regardless of the density of the wiring electrodes 7, and as a result, the multilayer wiring board 2 is manufactured with high dimensional accuracy.

In addition, in the multilayer wiring board 2, a difference in the amount of shrinkage of the ceramic layers 5a to 5e at the time of firing between a portion in which one of the wiring electrodes 7 is formed and a portion in which one of the wiring electrodes 7 is not formed is significantly reduced or prevented, and thus, the risk of things such as deterioration of the flatness of the multilayer wiring board 2 and occurrence of a fracture and a crack in the multilayer wiring board 2 is significantly reduced or prevented. Furthermore, while the risk of deterioration of the flatness of the multilayer wiring board 2 and occurrence of a fracture and a crack in the multilayer wiring board 2 is reduced, densification of the wiring electrodes 7 and a reduction in the pitch of the wiring electrodes 7 are also be achieved. In particular, in the multilayer wiring board 2 that is used in the probe card 1, there is a portion in which the wiring electrodes 7 are concentrated, and thus, there is a high risk of deterioration of the flatness of the multilayer wiring board 2 and occurrence of warpage and a crack in the multilayer wiring board 2. Therefore, the multilayer wiring board 2 that is manufactured by the above-described manufacturing method is suitable for the multilayer wiring board 2 that is used in the probe card 1.

In the insulating layers 3b to 3d, which are positioned in the multilayer body as inner layers of the multilayer body, since a stress that is applied at the time of press-bonding is absorbed and reduced by the other insulating layers, subduction of the wiring electrodes 7 toward the insulating layers 3a to 3e that causes the thicknesses of the shrinkage suppression layers 6a to 6e to be reduced is small. On the other hand, in the insulating layers 3a and 3e, which are the uppermost layer and the lowermost layer, respectively, a factor responsible for absorption and reduction of a stress at the time of press-bonding is smaller than that in the insulating layers 3b to 3d, which are positioned as the inner layers. Thus, a larger compressive stress is applied to the insulating layers 3a and 3e compared with to the insulating layers 3b to 3d, which are positioned as the inner layers, and the subduction of the wiring electrodes 7 toward the insulating layers 3a to 3e, which causes the thicknesses of the shrinkage suppression layers 6a to 6e to be reduced, becomes larger. Therefore, for example, in the case where there is a wiring electrode 7 such as a land electrode for external connection on the uppermost layer, the thickness of a portion of the shrinkage suppression layer 6a around the periphery of the wiring electrode 7 is likely to be smaller than the thicknesses of the other portions of the shrinkage suppression layer 6a, and deterioration of the flatness of the multilayer wiring board 2 and occurrence of warpage and a crack in the multilayer wiring board 2, and so forth are likely to occur. Accordingly, in the insulating layers 3a and 3e, which are respectively the uppermost layer and the lowermost layer and on each of which a land electrode for external connection is to be formed, the thicknesses of the peripheral areas α of the shrinkage suppression layers 6a and 6e of the insulating layers 3a and 3e that are around the periphery of the corresponding land electrodes are larger than the thicknesses of the other areas of the shrinkage suppression layers 6a and 6e, so that a multilayer wiring board 2 that has a high effect of reducing occurrence of deterioration of the flatness of the multilayer wiring board 2 and occurrence of warpage and a crack in the multilayer wiring board 2 is manufactured.

The shrinkage suppression layers 6a to 6e contain, as a main component, a flame-retardant powder that is not sintered at the sintering temperature of a ceramic raw material powder out of which the ceramic layers 5a to 5e are made, so that the shrinkage suppression layers 6a to 6e will not be sintered at the time of firing the multilayer body, and thus, such a flame-retardant powder is suitable for a material out of which the shrinkage suppression layers 6a to 6e are made.

Second Preferred Embodiment

A multilayer wiring board 2a according to a second preferred embodiment of the present invention will be described with reference to FIG. 7A to FIG. 8C. Note that FIG. 7A to FIG. 8C are explanatory diagrams describing a method of manufacturing the multilayer wiring board 2a according to the second preferred embodiment. FIGS. 7A to 7D are diagrams that correspond to FIGS. 3A to 3D, which describe the method of manufacturing the multilayer wiring board 2 of the first preferred embodiment, and FIGS. 8A to 8C are diagrams that correspond to FIGS. 4A to 4D.

A difference between the multilayer wiring board 2a according to the present preferred embodiment and the multilayer wiring board 2 of the first preferred embodiment, which has been described with reference to FIG. 1 to FIG. 5, is that the multilayer wiring board 2a preferably is manufactured by a method that is different from the method of manufacturing the multilayer wiring board 2. The rest of the configuration of the multilayer wiring board 2a is preferably the same or substantially the same as that of the multilayer wiring board 2 of the first preferred embodiment, and thus, the same reference numerals will be used and description thereof will be omitted. In addition, fabrication of the insulating layers 3a to 3e will be described taking the insulating layer 3c as an example as in the case of describing the method of manufacturing the multilayer wiring board 2 of the first preferred embodiment.

Figure 7A:
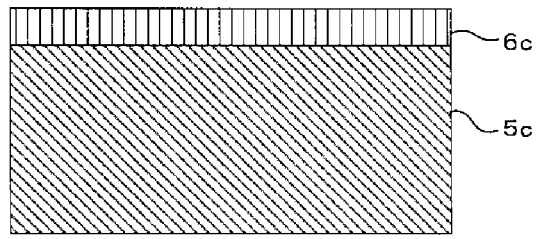
FIGS. 7A to 7D are explanatory diagrams describing a method of manufacturing a multilayer wiring board according to a second preferred embodiment of the present invention.
Figure 8A:
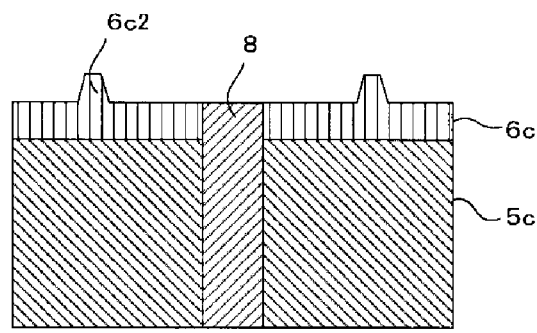
FIGS. 8A to 8C are explanatory diagrams describing the method of manufacturing the multilayer wiring board according to the second preferred embodiment of the present invention.
Figure 8B:
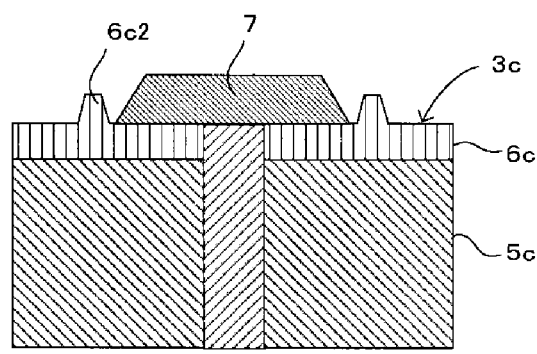
Figure 8C:
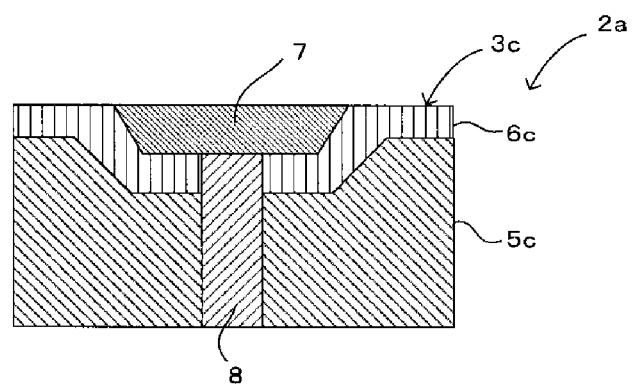

First, as illustrated in FIG. 7A, the shrinkage suppression layer 6c is stacked on top of the ceramic layer 5c in the same manner as the method of manufacturing the multilayer wiring board 2 of the first preferred embodiment.

Figure 7B:
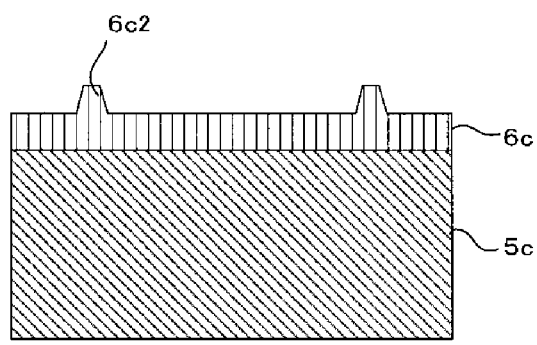

Next, as illustrated in FIG. 7B, a thick portion 6c2 that causes the thickness of the shrinkage suppression layer 6c to increase is formed. More specifically, the paste of the shrinkage suppression layer 6c is applied again, by using a printing technique or the like, onto the peripheral area α (see FIG. 5) around the periphery of an area in which one of the wiring electrodes 7 is to be formed in the surface of the shrinkage suppression layer 6c that is on the opposite side to the surface of the shrinkage suppression layer 6c that faces the ceramic layer 5c in such a manner that the thickness of the peripheral area α in the shrinkage suppression layer 6c becomes larger than the thicknesses of the other areas in the shrinkage suppression layer 6c.

Next, regarding an area in the insulating layer 3c in which one of the via conductors 8 is to be formed, as illustrated in FIG. 8A, a through hole is formed in the area by using a laser beam or the like, and the via conductor 8 is formed by a well-known method.

Figure 7C:
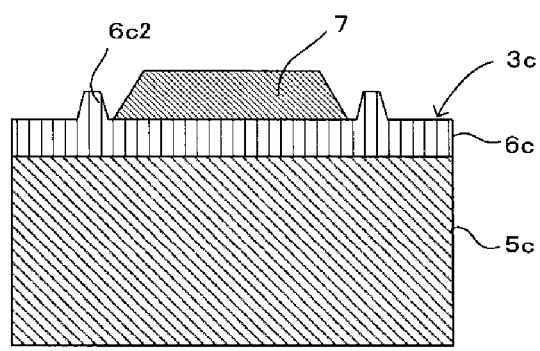
Figure 7D:
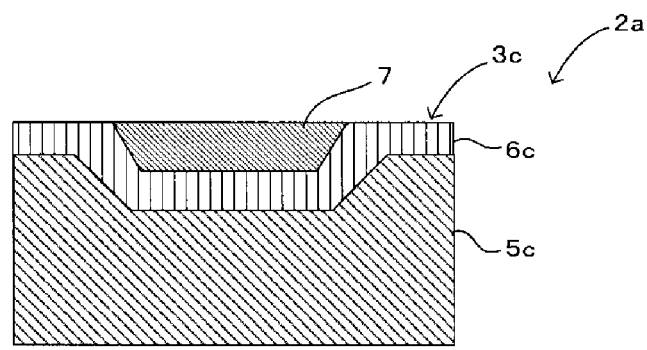

Next, as illustrated in FIG. 7C and FIG. 8B, one of the wiring electrodes 7 is formed in the same manner as the method of manufacturing the multilayer wiring board 2 of the first preferred embodiment. Note that the wiring electrode 7 may be formed before the thick portion 6c2, which causes the thickness of the shrinkage suppression layer 6c to increase, is formed.

Next, the insulating layers 3a to 3e that have been fabricated in the same manner are stacked on top of one another in a predetermined order (a stacking process), and the insulating layers 3a to 3e, which have been stacked on top of one another, are fixed to one another by applying pressure and then fired (a press-bonding process and a firing process) in the same manner as the method of manufacturing the multilayer wiring board 2 of the first preferred embodiment, so that the multilayer wiring board 2a is manufactured.

Manufacturing the multilayer wiring board 2a by such a method enables advantageous effects similar to those of the multilayer wiring board 2 of the first preferred embodiment to be obtained.

Third Preferred Embodiment

A multilayer wiring board 2b according to a third preferred embodiment of the present invention will be described with reference to FIG. 9A to FIG. 10C. Note that FIG. 9A to FIG. 10C are explanatory diagrams describing a method of manufacturing the multilayer wiring board 2b according to the third preferred embodiment. FIGS. 9A to 9D are diagrams that correspond to FIGS. 3A to 3D, which describe the method of manufacturing the multilayer wiring board 2 of the first preferred embodiment, and FIGS. 10A to 10C are diagrams that correspond to FIGS. 4A to 4D.

A difference between the multilayer wiring board 2b according to the present preferred embodiment and the multilayer wiring board 2 of the first preferred embodiment, which has been described with reference to FIG. 1 to FIG. 5, is that the multilayer wiring board 2b preferably is manufactured by a method that is different from the method of manufacturing the multilayer wiring board 2. The rest of the configuration of the multilayer wiring board 2b preferably is the same or substantially the same as that of the multilayer wiring board 2 of the first preferred embodiment, and thus, the same reference numerals will be used and description thereof will be omitted. In addition, fabrication of the insulating layers 3a to 3e will be described taking the insulating layer 3c as an example as in the case of describing the method of manufacturing the multilayer wiring board 2 of the first preferred embodiment.

Figure 9A:
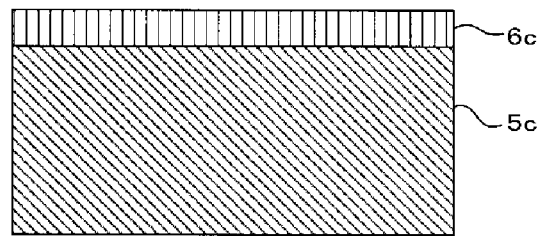
FIGS. 9A to 9D are explanatory diagrams describing a method of manufacturing a multilayer wiring board according to a third preferred embodiment of the present invention.
Figure 9B:
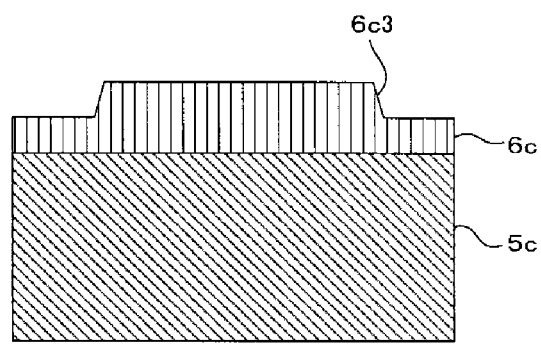

First, as illustrated in FIG. 9A, the shrinkage suppression layer 6c is applied on the ceramic layer 5c and dried in the same manner as the method of manufacturing the multilayer wiring board 2 of the first preferred embodiment. Next, as illustrated in FIG. 9B, a thick portion 6c3 that causes the thickness of the shrinkage suppression layer 6c to increase is formed. More specifically, when one of the wiring electrodes 7 is formed, the thicknesses of a contact area of the shrinkage suppression layer 6c that is in contact with the wiring electrode 7 and the peripheral area α (see FIG. 5) of the shrinkage suppression layer 6c around the periphery of the contact area are set to be larger than the thicknesses of the other areas of the shrinkage suppression layer 6c.

Figure 10A:
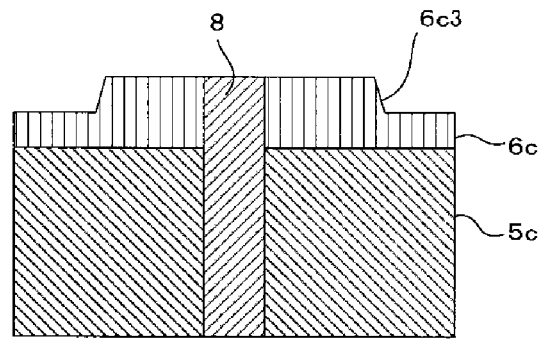
FIGS. 10A to 10C are explanatory diagrams describing the method of manufacturing the multilayer wiring board according to the third preferred embodiment of the present invention.
Figure 10B:
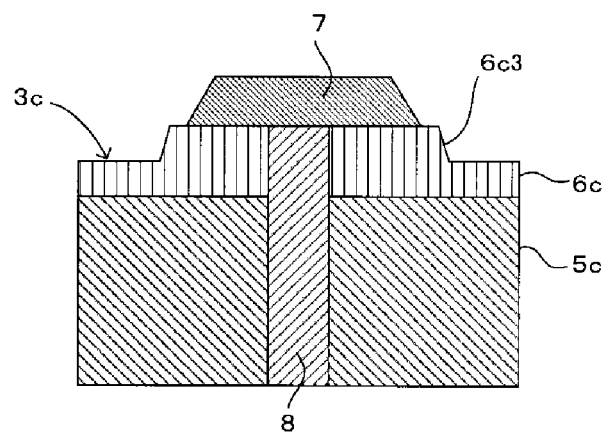
Figure 10C:
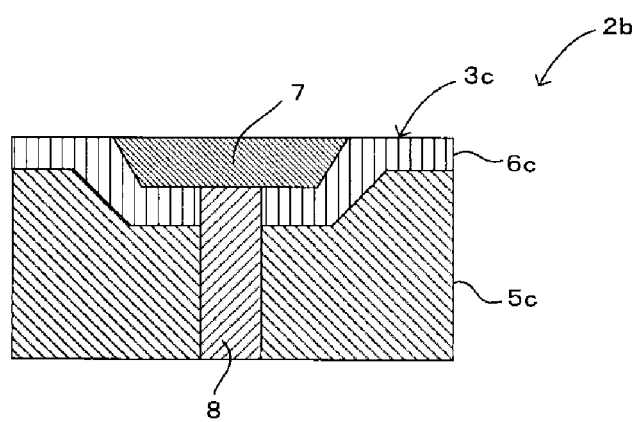

Next, regarding an area in the insulating layer 3c in which one of the via conductors 8 is to be formed, as illustrated in FIG. 10A, a through hole is formed in the area by using a laser beam or the like, and the via conductor 8 is formed by a well-known method.

Figure 9C:
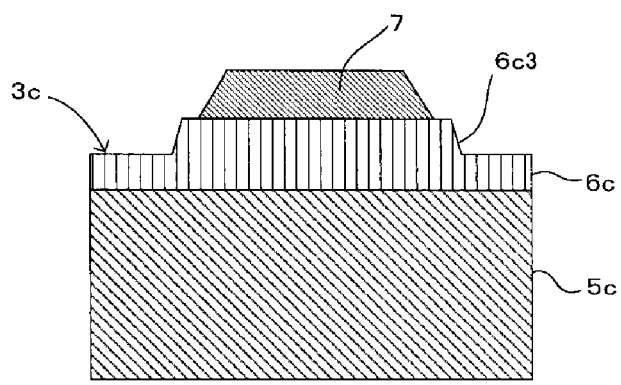
Figure 9D:
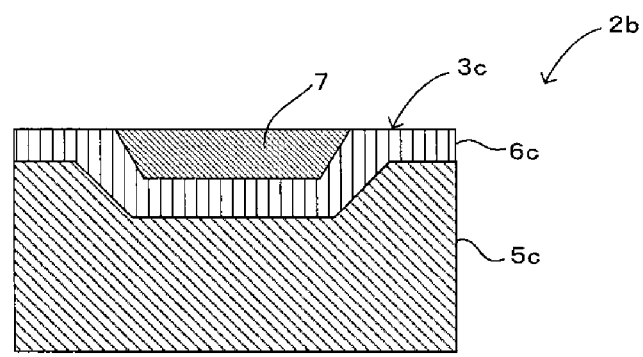

Next, as illustrated in FIG. 9C and FIG. 10B, the wiring electrode 7 is formed in a predetermined area of the thick portion 6c3 of the shrinkage suppression layer 6c in the same manner as the method of manufacturing the multilayer wiring board 2 of the first preferred embodiment.

In the following process, manufacture of the multilayer wiring board 2b is completed by stacking on top of one another the insulating layers 3a to 3e in the same manner as the method of manufacturing the multilayer wiring board 2 of the first preferred embodiment and performing the press-bonding and firing processes on the insulating layers 3a to 3e, which have been stacked on top of one another.

Manufacturing the multilayer wiring board 2b by such a method enables advantageous effects similar to those of the multilayer wiring board 2 of the first preferred embodiment to be obtained. In addition, both the contact area of the shrinkage suppression layer 6c, which is in contact with the wiring electrode 7, and the peripheral area α of the shrinkage suppression layer 6c around the periphery of the contact area are formed in such a manner as to have a thickness larger than the thicknesses of the other portions of the shrinkage suppression layer 6c, so that there is no need to strictly manage the accuracy with which the thick portion 6c3 of the shrinkage suppression layer 6c is formed as compared with the case where only the peripheral area α is formed so as to have a large thickness, and thus, the multilayer wiring board 2b can be easily manufactured. Furthermore, the area of a portion of each of the shrinkage suppression layers 6a to 6e whose thickness is set to be large (e.g., the thick portion 6c3) is increased, so that, for example, even if the wiring electrodes 7 are displaced when the wiring electrodes 7 are formed, the wiring electrodes 7 do not easily separate from the portions of the shrinkage suppression layers 6a to 6e whose thicknesses have been increased, and thus, tolerance for positional deviation of the wiring electrodes 7 is also improved.

Fourth Preferred Embodiment

A multilayer wiring board 2c according to a fourth preferred embodiment of the present invention will be described with reference to FIG. 11A to FIG. 12C. Note that FIG. 11A to FIG. 12C are explanatory diagrams describing a method of manufacturing the multilayer wiring board 2c according to the fourth preferred embodiment. FIGS. 11A to 11D are diagrams that correspond to FIGS. 3A to 3D, which describe the method of manufacturing the multilayer wiring board 2 of the first preferred embodiment, and FIGS. 12A to 12C are diagrams that correspond to FIGS. 4A to 4D.

A difference between the multilayer wiring board 2c according to the present preferred embodiment and the multilayer wiring board 2 of the first preferred embodiment, which has been described with reference to FIG. 1 to FIG. 5, is that the multilayer wiring board 2c preferably is manufactured by a method that is different from the method of manufacturing the multilayer wiring board 2. The rest of the configuration of the multilayer wiring board 2c preferably is the same or substantially the same as that of the multilayer wiring board 2 of the first preferred embodiment, and thus, the same reference numerals will be used and description thereof will be omitted. In addition, fabrication of the insulating layers 3a to 3e will be described taking the insulating layer 3c as an example as in the case of describing the method of manufacturing the multilayer wiring board 2 of the first preferred embodiment.

Figure 11A:
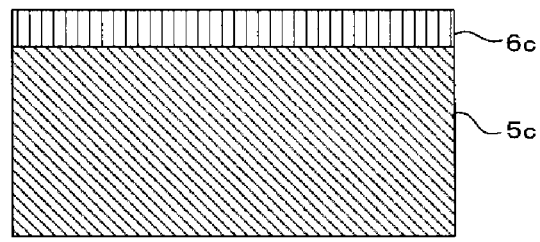
FIGS. 11A to 11D are explanatory diagrams describing a method of manufacturing a multilayer wiring board according to a fourth preferred embodiment of the present invention.
Figure 12A:
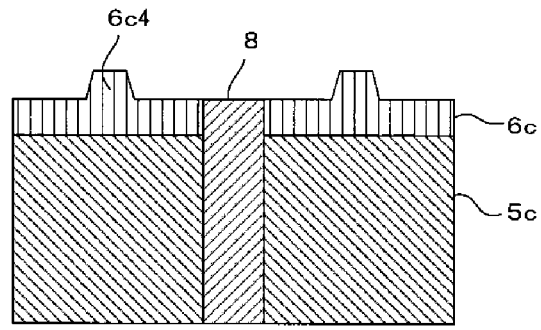
FIGS. 12A to 12C are explanatory diagrams describing the method of manufacturing the multilayer wiring board according to the fourth preferred embodiment of the present invention.
Figure 12B:
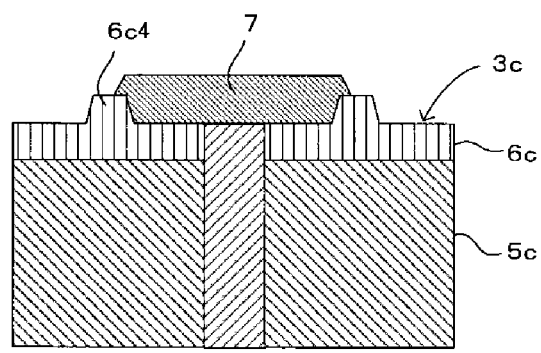
Figure 12C:
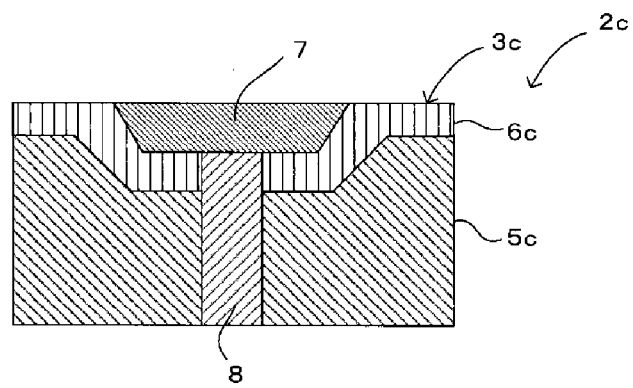
Figure 13:
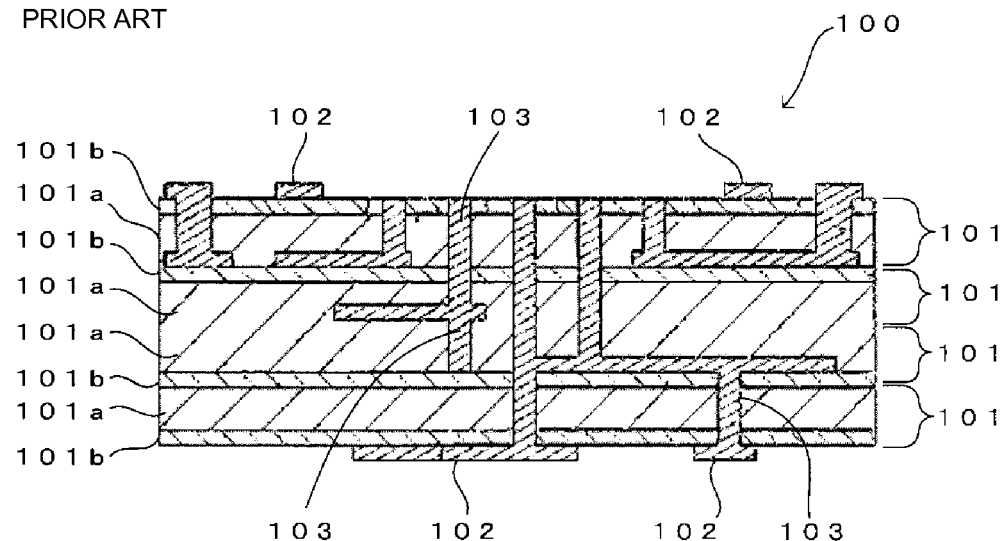
FIG. 13 is a sectional view of a multilayer wiring board of the related art.

First, as illustrated in FIG. 11A, the shrinkage suppression layer 6c is stacked on top of the ceramic layer 5c in the same manner as the method of manufacturing the multilayer wiring board 2 of the first preferred embodiment.

Figure 11B:
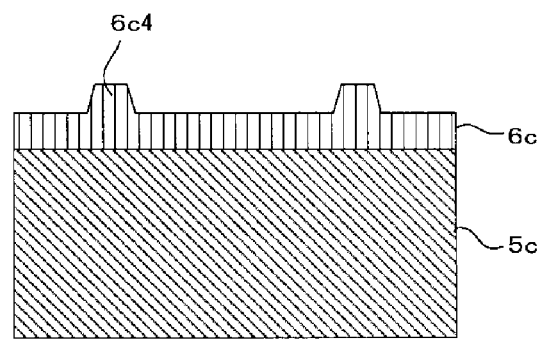

Next, as illustrated in FIG. 11B, a thick portion 6c4 that causes the thickness of the shrinkage suppression layer 6c to increase is formed. More specifically, the paste of the shrinkage suppression layer 6c is applied again, by using a printing technique or the like, onto a portion of the shrinkage suppression layer 6c that corresponds to the peripheral area α (see FIG. 5) around the periphery of an area in which one of the wiring electrodes 7 is to be formed of the surface of the shrinkage suppression layer 6c that is on the opposite side to the surface of the shrinkage suppression layer 6c that faces the ceramic layer 5c in such a manner that the thickness of the peripheral area α of the shrinkage suppression layer 6c becomes larger than the thicknesses of the other areas of the shrinkage suppression layer 6c. In this case, the thick portion 6c4 (the peripheral area α) is formed in such a manner as to have a width larger than the width of the thick portion 6c2 in the second preferred embodiment (see FIG. 7B and the like) in plan view.

Next, regarding an area in the insulating layer 3c in which one of the via conductors 8 is to be formed, as illustrated in FIG. 12A, a through hole is formed in the area by using a laser beam or the like, and the via conductor 8 is formed by a well-known method.

Figure 11C:
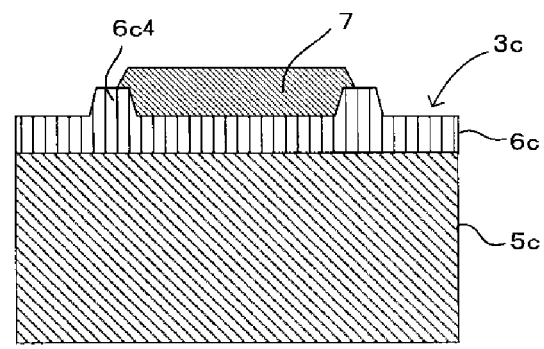
Figure 11D:
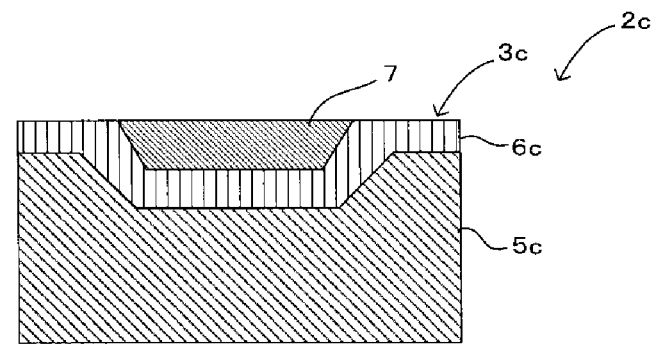

Next, as illustrated in FIG. 11C and FIG. 12B, the wiring electrode 7 preferably is formed in the same manner as the method of manufacturing the multilayer wiring board 2 of the first preferred embodiment. In this case, the wiring electrode 7 is formed on the shrinkage suppression layer 6c in such a manner as to fill a region surrounded by the thick portion 6c4 and cover a portion of the top surface of the thick portion 6c4.

Next, the insulating layers 3a to 3e that have been fabricated in the same manner are stacked on top of one another in a predetermined order (a stacking process), and the insulating layers 3a to 3e, which have been stacked on top of one another, are fixed to one another by applying pressure and then fired (a press-bonding process and a firing process) in the same manner as the method of manufacturing the multilayer wiring board 2 of the first preferred embodiment, so that the multilayer wiring board 2c is manufactured.

Manufacturing the multilayer wiring board 2c by such a method enables advantageous effects similar to those of the multilayer wiring board 2 of the first preferred embodiment to be obtained.

Note that the present invention is not limited to the above-described preferred embodiments, and various changes can be made to the above-described preferred embodiments within the scope of the present invention. For example, although the thick portions 6c1 to 6c4 preferably are formed on the shrinkage suppression layers 6a to 6e in the above-described preferred embodiments, for example, the thick portions 6c1 to 6c4 may be formed only on the shrinkage suppression layers 6a and 6e, which are the uppermost layer and the lowermost layer, respectively, and to which a large compressive stress is applied at the time of fixing the layers of the multilayer body to one another by applying pressure.

The wiring electrodes 7 and the via conductors 8 are not necessarily formed on and in all of the insulating layers 3a to 3e, for example.

Although the case where each of the ceramic layers 5a to 5e preferably is made of low-temperature co-fired ceramic has been described in the above-described preferred embodiments, various ceramic materials can be used as the material out of which the ceramic layers 5a to 5e are made.

Preferred embodiments of the present invention preferably are applicable to various multilayer wiring boards each of which includes a multilayer body formed by stacking on top of one another a plurality of insulating layers, each of which includes a ceramic layer and a shrinkage suppression layer that is stacked on top of the ceramic layer, fixing them to one another by applying pressure, and then performing firing.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method of manufacturing a multilayer wiring board comprising:
   a stacking process in which a plurality of insulating layers, each of which includes a ceramic layer and a shrinkage suppression layer that is stacked on top of the ceramic layer and that suppresses shrinkage of the ceramic layer, are stacked on top of one another;
   a press-bonding process in which the plurality of insulating layers are fixed to one another by applying pressure, so that a multilayer body is formed; and
   a firing process in which the multilayer body is fired; wherein
   in at least one of the insulating layers, a wiring electrode is formed on a surface of the shrinkage suppression layer on an opposite side to a surface of the shrinkage suppression layer that faces the ceramic layer in the stacking process, and a thickness of at least a peripheral area of the shrinkage suppression layer that is located around a periphery of a contact area of the shrinkage suppression layer that is in contact with the wiring electrode is set to be larger than thicknesses of portions of the shrinkage suppression layer except for the peripheral area.

2. The method of manufacturing a multilayer wiring board according to claim 1, wherein
   in the at least one of the insulating layers, a thickness of the contact area of the shrinkage suppression layer, which is in contact with the wiring electrode, is set to be larger than thicknesses of portions of the shrinkage suppression layer except for the contact area and the peripheral area in the stacking process.

3. The method of manufacturing a multilayer wiring board according to claim 1, wherein
   in the stacking process, the shrinkage suppression layer of the at least one of the insulating layers defines an uppermost layer or a lowermost layer of the multilayer body; and
   a land electrode for external connection is formed by the wiring electrode.

4. The method of manufacturing a multilayer wiring board according to claim 1, wherein the shrinkage suppression layer of each of the insulating layers includes, as a main component, a flame-retardant powder that is not sintered at a sintering temperature of a ceramic raw material powder out of which the ceramic layers are made.

5. The method of manufacturing a multilayer wiring board according to claim 1, wherein the shrinkage suppression layer is formed of paste and includes a step of repeatedly applying the paste to the peripheral area around a periphery of the contact area.

6. The method of manufacturing a multilayer wiring board according to claim 1, wherein the shrinkage suppression layer is formed of paste and includes a step of applying the paste to cover a side surface of the wiring electrode and a circumferential edge portion of the surface of the wiring electrode that is on the opposite side to a major surface of the wiring electrode that is in contact with the shrinkage suppression layer.

7. The method of manufacturing a multilayer wiring board according to claim 1, wherein the shrinkage suppression layer is formed so as to cover a portion of the wiring electrode at a boundary between the wiring electrode and an opening of the recess.

8. The method of manufacturing a multilayer wiring board according to claim 1, wherein a thick portion that increases a thickness of the shrinkage suppression layer is formed on the shrinkage suppression layer so as to define an increased thickness portion that has a larger thickness than other areas of the shrinkage suppression layer.

9. The method of manufacturing a multilayer wiring board according to claim 1, wherein both the contact area of the shrinkage suppression layer and the peripheral area of the shrinkage suppression layer around the periphery of the contact area are formed to have a thickness larger than the thicknesses of the other portions of the shrinkage suppression layer.

10. A probe card comprising:
    a multilayer wiring board that is manufactured by the method of manufacturing according to claim 1.

11. A multilayer wiring board comprising:
    a multilayer body including a plurality of insulating layers stacked on top of one another, each of the plurality of insulating layers including a ceramic layer and a shrinkage suppression layer that is stacked on top of the ceramic layer and that suppresses shrinkage of the ceramic layer, the plurality of insulating layers being pressure bonded to one another and fired; wherein
    the multilayer body includes a recess that is produced by a bent portion of the shrinkage suppression layer of one of the insulating layers, which is an uppermost layer of the multilayer body, and includes a wiring electrode that is configured such that the recess is filled with the wiring electrode; and
    a thickness of a portion of the shrinkage suppression layer of the insulating layer, which is the uppermost layer, that defines the recess is larger than thicknesses of other portions of the shrinkage suppression layer.

12. The multilayer wiring board according to claim 11, wherein the shrinkage suppression layer of the insulating layer, which is the uppermost layer, covers a portion of the wiring electrode at a boundary between the wiring electrode and an opening of the recess.

13. The multilayer wiring board according to claim 11, wherein in the at least one of the insulating layers, a thickness of the contact area of the shrinkage suppression layer, which is in contact with the wiring electrode, is larger than thicknesses of portions of the shrinkage suppression layer except for the contact area and the peripheral area in the stacking process.

14. The multilayer wiring board according to claim 11, wherein
the shrinkage suppression layer of the at least one of the insulating layers defines an uppermost layer or a lowermost layer of the multilayer body; and
a land electrode for external connection is defined by the wiring electrode.

15. The multilayer wiring board according to claim 11, wherein the shrinkage suppression layer of each of the insulating layers includes, as a main component, a flame-retardant powder that is not sintered at a sintering temperature of a ceramic raw material powder out of which the ceramic layers are made.

16. The multilayer wiring board according to claim 11, wherein the shrinkage suppression layer is made of paste and includes an increased thickness portion around a periphery of the contact area.

17. The multilayer wiring board according to claim 11, wherein the shrinkage suppression layer is made of paste that covers a side surface of the wiring electrode and a circumferential edge portion of the surface of the wiring electrode that is on the opposite side to a major surface of the wiring electrode that is in contact with the shrinkage suppression layer.

18. The multilayer wiring board according to claim 11, wherein the shrinkage suppression layer covers a portion of the wiring electrode at a boundary between the wiring electrode and an opening of the recess.

19. The multilayer wiring board according to claim 11, wherein a thick portion that increases a thickness of the shrinkage suppression layer is arranged on the shrinkage suppression layer so as to define an increased thickness portion that has a larger thickness than other areas of the shrinkage suppression layer.

20. The multilayer wiring board according to claim 11, wherein both the contact area of the shrinkage suppression layer and the peripheral area of the shrinkage suppression layer around the periphery of the contact area have a thickness larger than the thicknesses of the other portions of the shrinkage suppression layer.

* * * * *